United States Patent
Ganachev et al.

(10) Patent No.: US 8,133,348 B2
(45) Date of Patent: Mar. 13, 2012

(54) PLASMA GENERATING APPARATUS AND PLASMA TREATMENT APPARATUS

(75) Inventors: Ivan Petrov Ganachev, Kanagawa-ken (JP); Yoshikazu Tsugami, Kanagawa-ken (JP); Kohei Shimatani, Kanagawa-ken (JP); Masashi Yamage, Kanagawa-ken (JP)

(73) Assignees: Shibaura Mechatronics Corporation, Yokohama-shi (JP); Kabushiki Kaisha Toshiba, Tokyo (JP)

( * ) Notice: Subject to any disclaimer, the term of this patent is extended or adjusted under 35 U.S.C. 154(b) by 934 days.

(21) Appl. No.: 11/914,954

(22) PCT Filed: Apr. 26, 2006

(86) PCT No.: PCT/JP2006/308777
§ 371 (c)(1),
(2), (4) Date: Jun. 11, 2008

(87) PCT Pub. No.: WO2006/123524
PCT Pub. Date: Nov. 23, 2006

(65) Prior Publication Data
US 2009/0045749 A1    Feb. 19, 2009

(30) Foreign Application Priority Data
May 20, 2005  (JP) .................................. 2005-147662

(51) Int. Cl.
*H01L 21/306*  (2006.01)
(52) U.S. Cl. .............................. 156/345.36; 156/345.41
(58) Field of Classification Search ............. 156/345.35, 156/345.36, 345.41, 345.51; 118/723 MW, 118/723 AN
See application file for complete search history.

(56) References Cited

U.S. PATENT DOCUMENTS

| | | | | |
|---|---|---|---|---|
| 6,034,346 A * | 3/2000 | Yoshioka et al. | ........ | 219/121.43 |
| 6,172,321 B1 * | 1/2001 | Yoshioka et al. | ........ | 219/121.41 |
| 6,376,796 B2 * | 4/2002 | Sato et al. | ................ | 219/121.43 |
| 6,823,816 B2 * | 11/2004 | Ishii et al. | ............. | 118/723 MW |
| 6,847,003 B2 * | 1/2005 | Ishii et al. | ................ | 219/121.43 |
| 6,884,318 B2 * | 4/2005 | Suzuki | ..................... | 156/345.41 |

FOREIGN PATENT DOCUMENTS

| | | |
|---|---|---|
| JP | 6-260802 | 9/1994 |
| JP | 9 148097 | 6/1997 |
| JP | 2003 124193 | 4/2003 |
| JP | 2003 168677 | 6/2003 |
| JP | 2003 282297 | 10/2003 |
| JP | 2004 128090 | 4/2004 |
| JP | 2006 186876 | 7/2006 |
| TW | 200414274 A | 8/2004 |

OTHER PUBLICATIONS

Office Action issued Nov. 22, 2010, in Japanese Patent Application No. 2005-147662 with English-language translation.
Office Action issued Aug. 17, 2011, in Japanese Patent Application No. 2005-147662 with English translation.
Office Action (with English translation) issued on Oct. 31, 2011, in corresponding Taiwanese Patent Application No. 095115835 (10 pages).

* cited by examiner

*Primary Examiner* — Thuy Vinh Tran
(74) *Attorney, Agent, or Firm* — Oblon, Spivak, McClelland, Maier & Neustadt, L.L.P.

(57) ABSTRACT

A plasma generating apparatus includes a coaxial convertor for coaxial-converting a microwave, a generally annular ring slot that passes the coaxial-converted microwave, and a dielectric window that propagates the microwave passed through the ring slot. A plasma is produced by the microwave propagated through the dielectric window. This enables stable formation of a plasma having a uniform distribution over a large area.

10 Claims, 17 Drawing Sheets

PLASMA GENERATING APPARATUS AND PLASMA TREATMENT APPARATUS

TECHNICAL FIELD

This invention relates to a plasma generating apparatus and a plasma processing apparatus, and more particularly to a plasma generating apparatus capable of forming a plasma having an arbitrary distribution inside a plasma generating chamber and to a plasma processing apparatus such as an etching apparatus equipped therewith.

BACKGROUND ART

Plasma-assisted dry processes are used in widespread technologies such as semiconductor manufacturing apparatuses, surface hardening of metal components, surface activation of plastic components, and chemical-free sterilization. For example, various plasma processings such as ashing, dry etching, thin film deposition, and surface modification are used in manufacturing semiconductor devices and liquid crystal displays. Plasma-assisted dry processes are low-cost and high-speed, and also have an advantage that environmental pollution can be reduced because no chemicals are used.

A typical apparatus for performing such plasma processing is a plasma processing apparatus of the "microwave excitation type" where a plasma is excited by a microwave having a frequency of 100 MHz to several 10 GHz. The plasma source of the microwave excitation type has a lower plasma potential than high-frequency plasma sources and the like, and hence are widely used for damage-free resist ashing and voltage-biased anisotropic etching.

The area of semiconductor wafers and liquid crystal display glass substrates to be processed is increasing year by year. Hence plasma processing therefor requires a plasma generating apparatus capable of generating a plasma dense and uniform over a large area.

In response to such requirement, one of the inventors disclosed a plasma processing apparatus where a microwave guided through a rectangular waveguide is introduced into an annular space through a coaxial line and introduced into a chamber through a plurality of arc-shaped slits (Patent Document 1), Patent Document 1: JP-A 2003-124193 (Kokai)

However, workpieces subjected to plasma processing are growing larger and larger in size, and there is a demand for a plasma generating apparatus capable of stably generating a plasma uniform over a large area. Furthermore, during actual plasma processing, the conditions of plasma processing may be often changed variously depending on the type and number of workpieces. Hence it is desirable that a uniform plasma can be stably generated over a wide range of conditions.

The invention has been made on the basis of recognition of these problems. An object of the invention is to provide a plasma generating apparatus capable of stably forming a plasma having a uniform distribution over a large area and a plasma processing apparatus equipped therewith.

SUMMARY OF THE INVENTION

To achieve the above object, in an aspect of the invention, a plasma generating apparatus is provided, which includes coaxial conversion means for coaxial-converting a microwave, a generally annular ring slot for passing the coaxial-converted microwave, and a dielectric window for propagating the microwave passed through the ring slot, wherein a plasma can be produced by the microwave propagated through the dielectric window.

Furthermore, in another aspect of the invention, a plasma generating apparatus is provided, which includes coaxial conversion means for coaxial-converting a microwave, a plurality of slots provided on a generally identical circle as viewed from central axis of the coaxial conversion means, the slots passing the coaxial-converted microwave, and a dielectric member for propagating the microwave passed through the slot, wherein the dielectric member has a protrusion tapered toward a tip located opposite to the slot, and a plasma can be produced by the microwave propagated through the dielectric member.

On the other hand, in another aspect of the invention, a plasma generating apparatus is provided, which includes the plasma generating apparatus according to any one described above, wherein plasma processing of a workpiece can be performed by the generated plasma.

Figure 1:
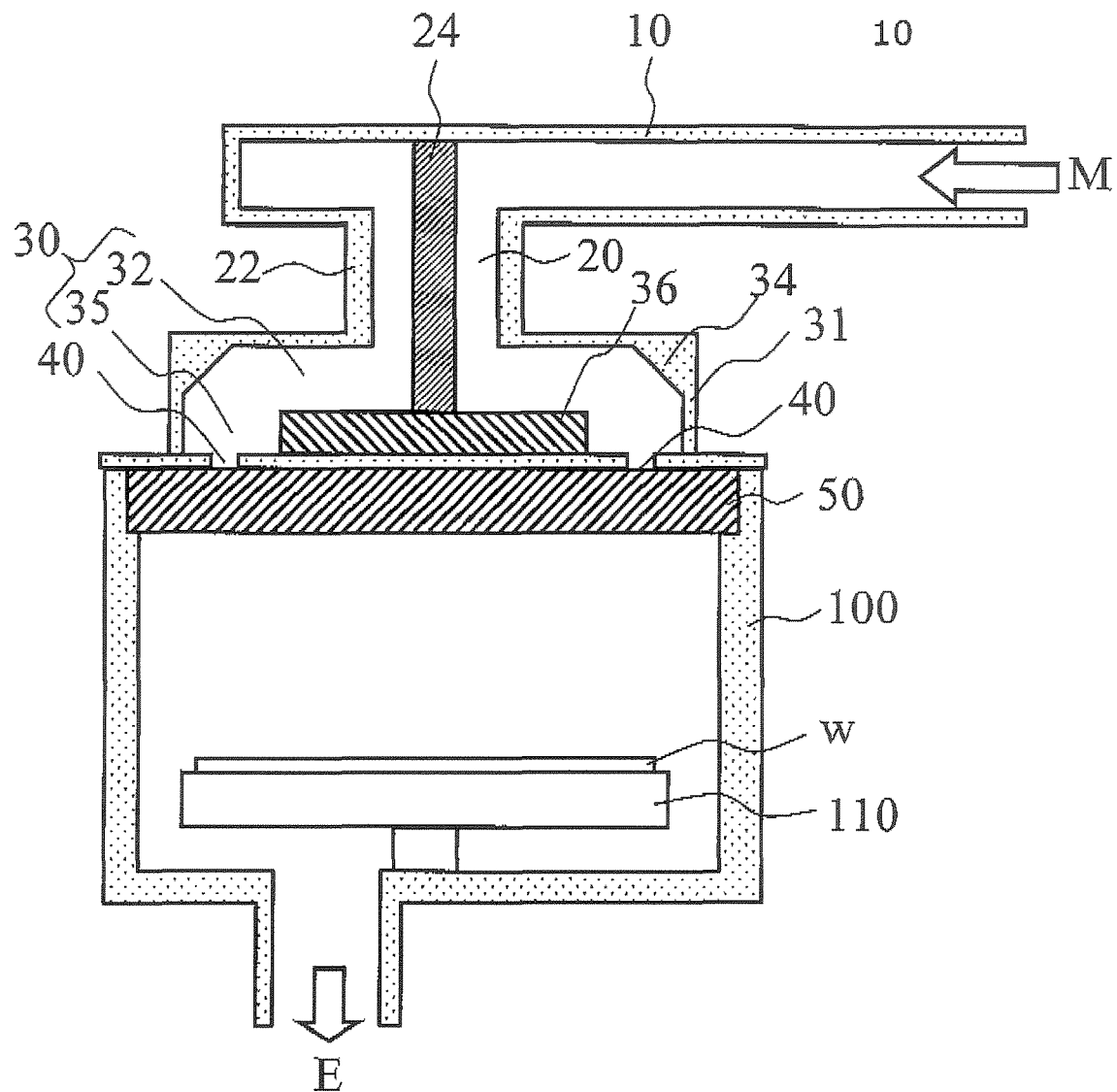
FIG. 1 is a conceptual view for illustrating the basic configuration of the main part of a plasma processing apparatus according to an embodiment of the invention.

DESCRIPTION OF REFERENCE NUMERALS 10 waveguide
20 coaxial introduction section
24 core
30 coaxial conversion section
32 waveguide
36 shield
40 ring slot
42 slot
50, 52, 54 window
58 shield plate
60 protrusion
100 chamber
102 slot
110 stage
120 coaxial introduction section
124 coaxial cable
130 cavity
132 adjusting cavity
140 slot antenna
150 window
160 dielectric tube
182 plunger
184 plunger

DETAILED DESCRIPTION OF THE INVENTION

Embodiments of the invention will now be described in detail with reference to examples.

FIG. 1 is a conceptual view for illustrating the basic configuration of the main part of a plasma processing apparatus according to the embodiment of the invention.

Figure 2:
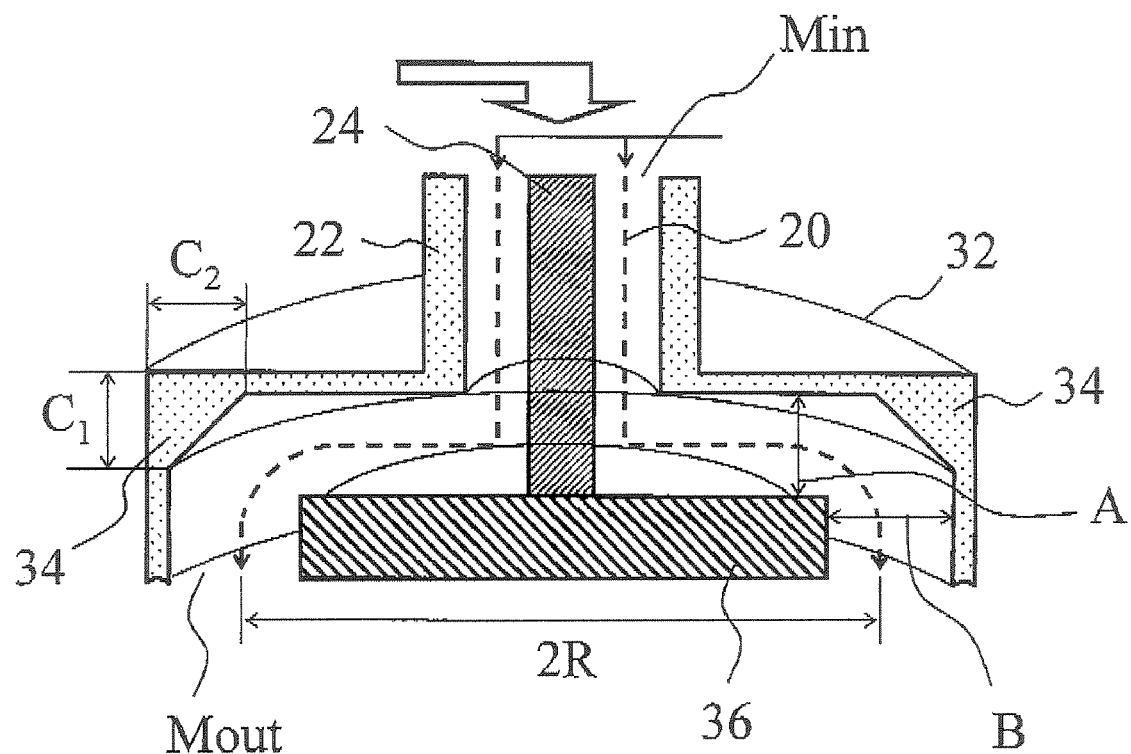
FIG. 2 is a perspective cross-sectional view with its microwave introduction section enlarged.
Figure 3:
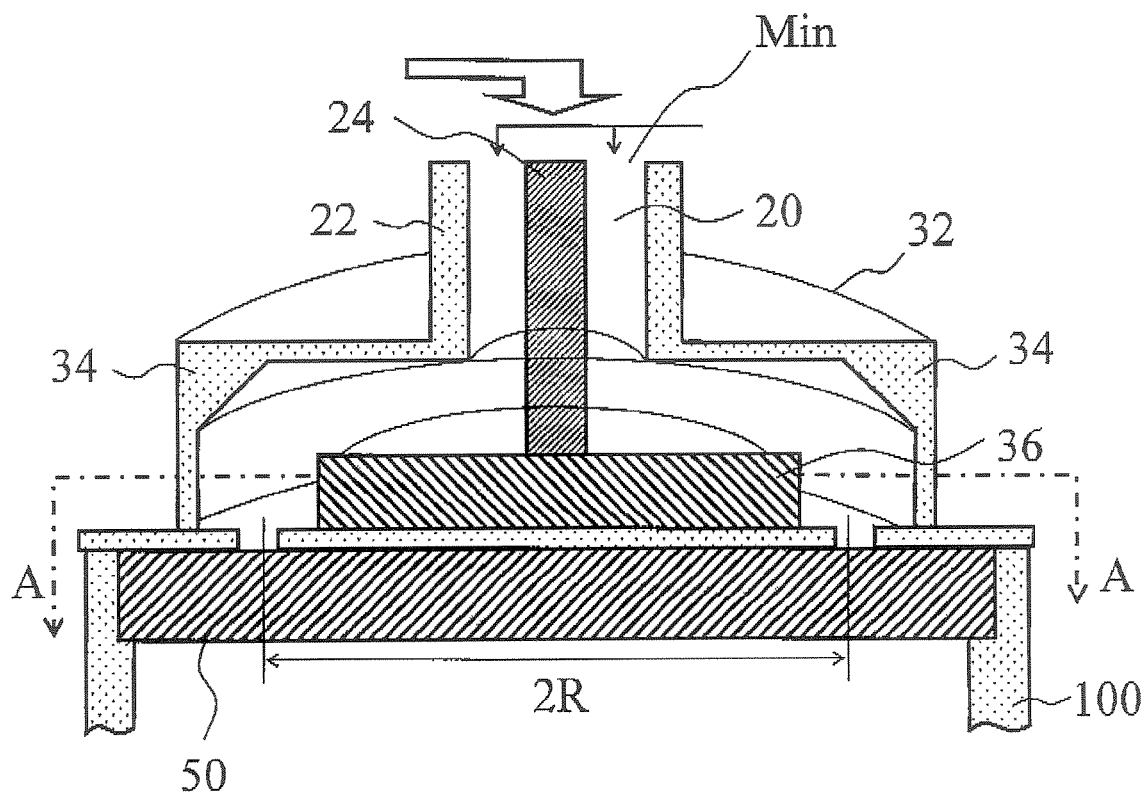
FIG. 3 is a perspective cross-sectional view with its plasma generator enlarged.

FIG. 2 is a perspective cross-sectional view with its microwave introduction section enlarged, and FIG. 3 is a perspective cross-sectional view with its plasma generator enlarged.

The plasma processing apparatus according to this embodiment includes a chamber 100 and a microwave introduction section connected thereto. The microwave introduction section includes a waveguide 10, a coaxial introduction section 20, a coaxial conversion section 30, and a ring slot 40. A microwave M having a frequency of 100 MHz to several 10 GHz supplied from a microwave power supply through a tuner (not shown) propagates through the waveguide 10 having a generally rectangular cross section and is supplied to the ring slot 40 through the coaxial introduction section 20 and the coaxial conversion section 30.

The coaxial introduction section 20 includes a generally cylindrical waveguide 22 provided generally coaxially with the central axis of the ring slot 40, and a core 24 provided near the central axis, propagating the microwave M generally parallel to the central axis.

The coaxial conversion section 30 includes a cylindrical space 32 provided generally coaxially with the central axis and having a larger diameter than the coaxial introduction section 20, and an annular space 35. The cylindrical space 32 and the annular space 35 are defined by a waveguide 31 having a larger diameter than the waveguide 22 and by a generally disk-shaped shield 36 provided therein.

The cylindrical space 32 includes a bevel 34 at the corner opposite to the annular space 35 so that the microwave M is smoothly propagated in the coaxial conversion section 30 without unnecessary reflection and loss.

The microwave M propagated through the coaxial introduction section 20 is spread in the cylindrical space 32 in a direction generally vertical to the central axis and guided through the annular space 35 to the ring slot 40.

On the other hand, the upper surface of the chamber 100 is provided with a window 50 made of dielectric such as quartz glass or alumina. The microwave M is introduced from the ring slot 40 through the window 50 into the chamber 100.

The inside of the chamber 100 can be maintained in a reduced-pressure state by an evacuation means E. A workpiece W is mounted on a stage 110, and a prescribed gas is introduced through a gas introduction system, not shown. In this situation, a microwave M is introduced into the chamber to generate a plasma. Using this plasma, various plasma processings such as etching and surface modification can be performed on the workpiece W.

According to the embodiment of the invention, in the plasma processing apparatus like this, a plasma uniform over a large area can be stably generated by introducing the plasma from the coaxial introduction section 20 and the coaxial conversion section 30 through the ring slot 40 into the chamber 100. In the following, the operation of the plasma generating apparatus of this embodiment is described with reference to comparative examples.

FIGS. 4 to 8 are perspective cross-sectional views or cross-sectional views showing the main part of plasma generating apparatuses of the comparative examples investigated by the inventors in the course of reaching the invention.

Figure 4:
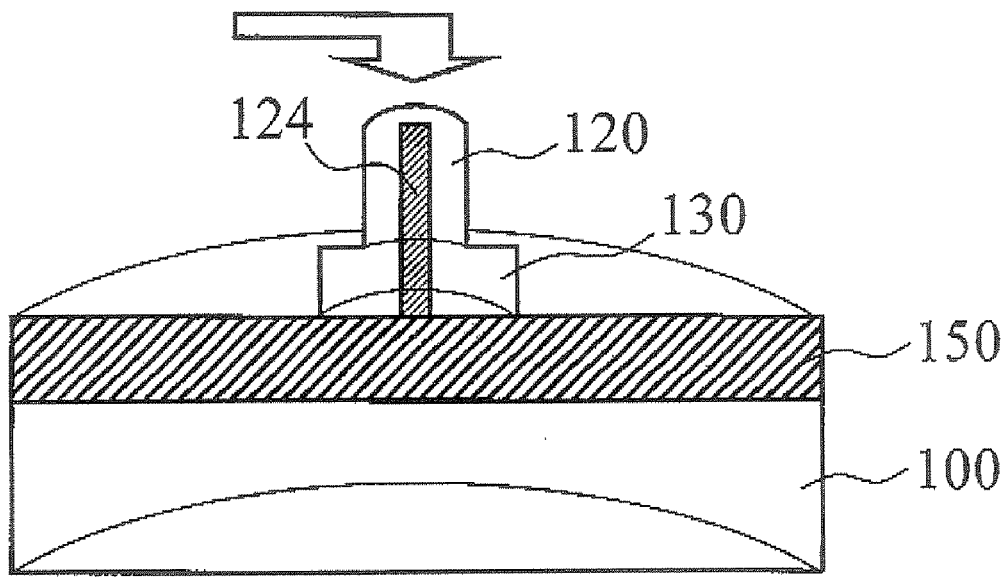
FIG. 4 is a perspective cross-sectional view showing the main part of a plasma generating apparatus of a comparative example investigated by the inventors in the course of reaching the invention.

In a comparative example shown in FIG. 4, the upper surface of the chamber 100 is provided with a dielectric window 150, and a microwave M is introduced from the coaxial introduction section 120 through a cylindrical cavity 130.

Figure 5:
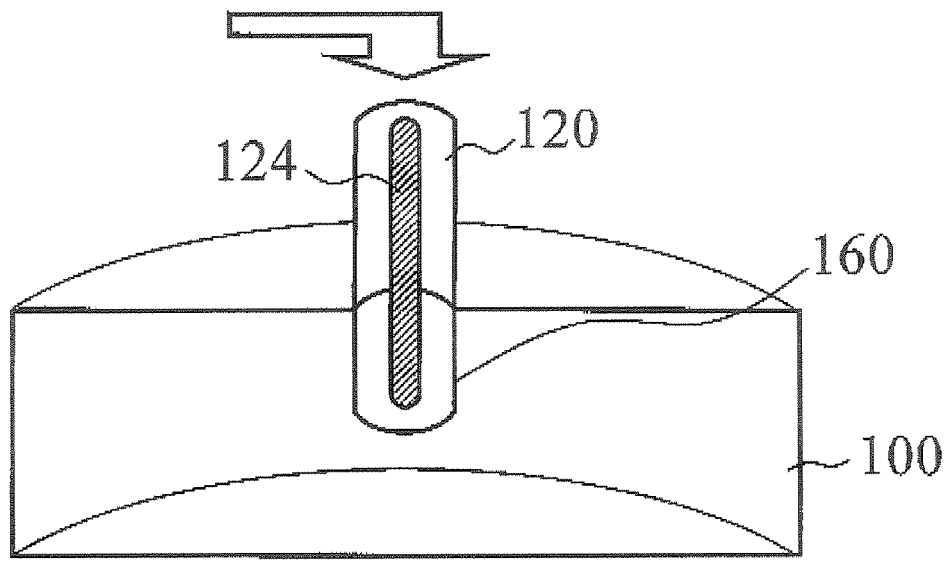
FIG. 5 is a perspective cross-sectional view showing the main part of a plasma generating apparatus of a comparative example investigated by the inventors in the course of reaching the invention.

In a comparative example shown in FIG. 5, the core of a coaxial cable 124 is covered with a dielectric tube 160 and projected into the chamber 100.

Figure 6:
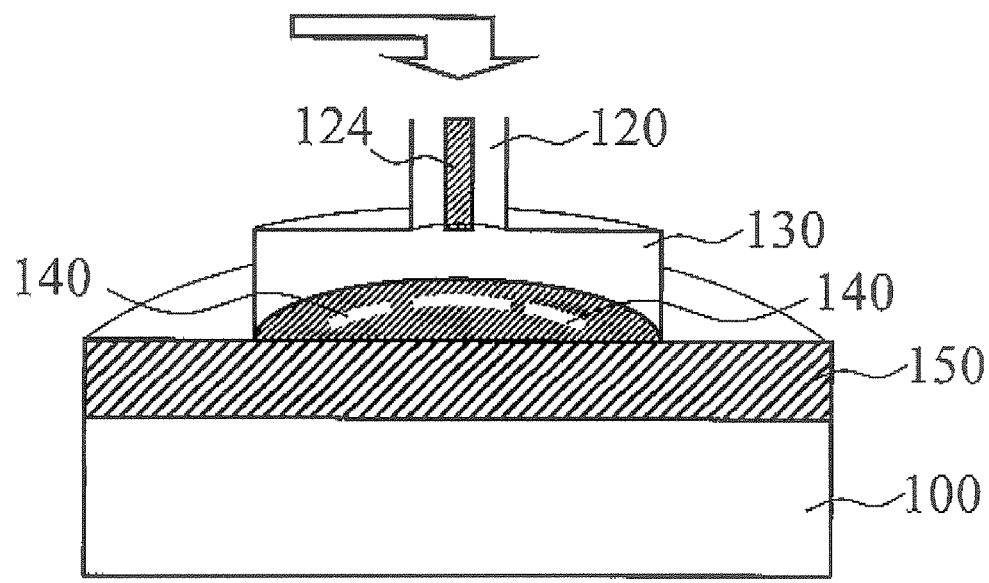
FIG. 6 is a perspective cross-sectional view showing the main part of a plasma generating apparatus of a comparative example investigated by the inventors in the course of reaching the invention.

In a comparative example shown in FIG. 6, a microwave M is introduced from the coaxial introduction section 120 into the cylindrical cavity 130, and introduced from a plurality of separate slot-like antennas 140 through a single dielectric window 150 into the chamber 100.

Figure 7:
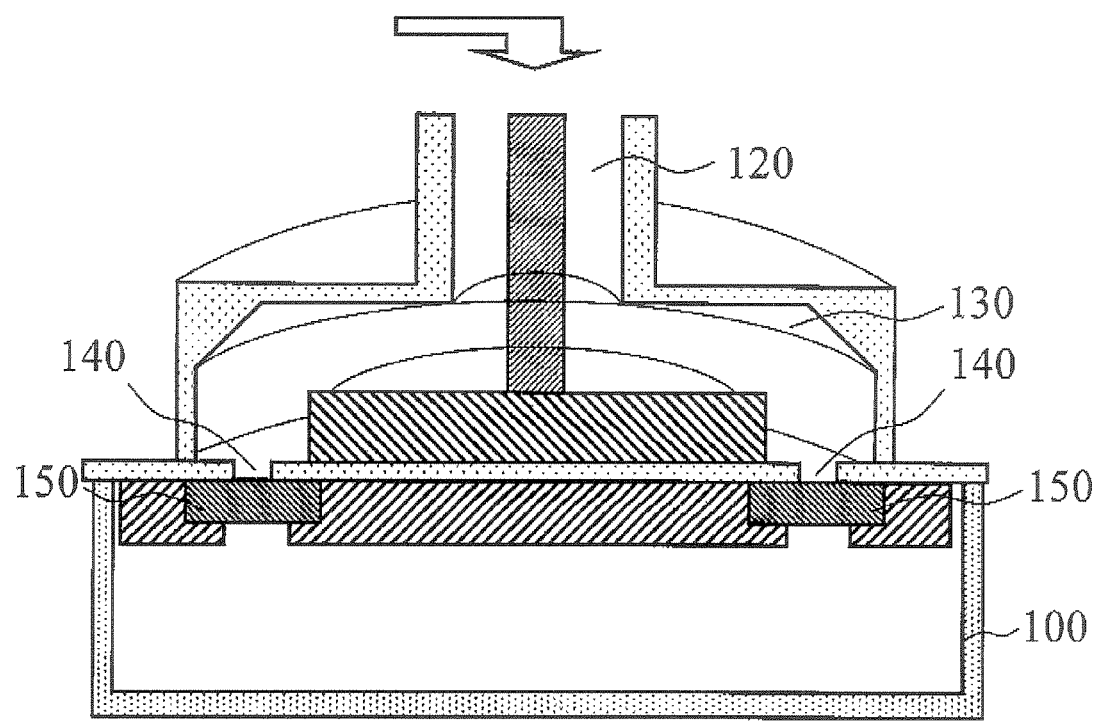
FIG. 7 is a cross-sectional view showing the main part of a plasma generating apparatus of a comparative example investigated by the inventors in the course of reaching the invention.

In a comparative example shown in FIG. 7, a microwave M is introduced from the coaxial introduction section 120 into a generally annular cavity 130, and introduced from a plurality of separate slot-like antennas 140 through a window 150 into the chamber 100. However, in this case, the dielectric window 150 is divided into parts, one for each of the slot-like antennas 140.

With regard to the comparative examples listed above, in the plasma generating apparatus where a microwave M is introduced from the vicinity of the center of the chamber 100 as illustrated in FIGS. 4 and 5, for example, the plasma density (or the processing rate of the plasma processing) is high at the center of the chamber, and low at the periphery of the chamber. Thus it is not easy to control the spatial distribution of plasma density.

The structure having a cavity on the dielectric (window 150) as illustrated in FIGS. 4 and 6 allows surface-wave resonance on the dielectric surface in the cavity and volume resonance, and their resonance frequencies depend on the plasma density. These two resonance frequencies can be matched with each other only in a limited range of electron density. Under the conditions outside this limited range of electron density, the absorption ratio of microwave power decreases, causing difficulty in continuous density control.

Figure 8:
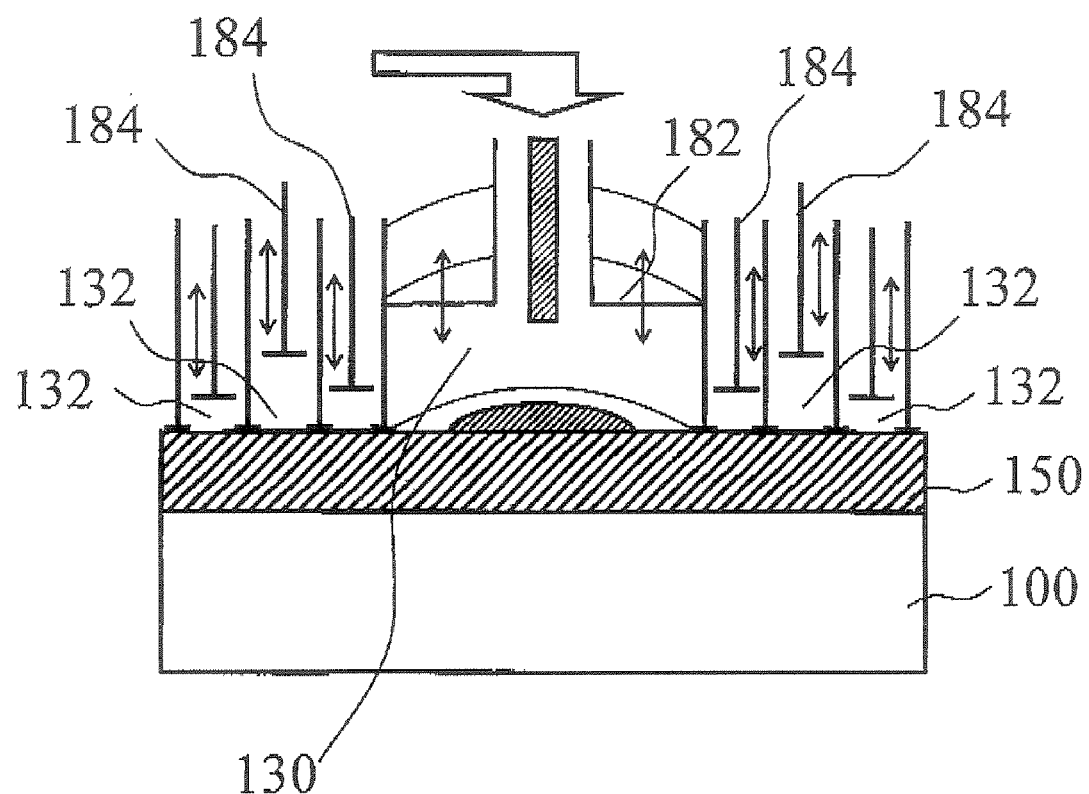
FIG. 8 is a perspective cross-sectional view showing the main part of a plasma generating apparatus of a comparative example investigated by the inventors in the course of reaching the invention.

To cope with this problem, a plurality of plungers 182, 184 need to be provided, for example, as shown in FIG. 8. Here, the plunger 182 can move vertically as shown by arrows to adjust the volume of the cavity 130. Each plunger 184 moves vertically as shown by arrows to form an adjusting cavity 132 on the window 150.

However, the plasma generating apparatus like this is complicated, and has room for improvement because it is cumbersome to adjust each of the plungers 182, 184 every time the electron density changes.

On the other hand, in the case of introducing a microwave M through a plurality of slot antennas 140 and a plurality of windows 150 into the chamber 100 as shown in FIG. 7, the plasma density has a nonuniform distribution on the circle as viewed from the central axis. More specifically, even in the case where the chamber 100 and the microwave excitation structure are axisymmetric, if their size is larger than the wavelength of the microwave, two modes exist, axisymmetric and nonaxisymmetric. The actually occurring mode is determined by uncontrollable factors such as plasma absorption ratio. Hence it is difficult to completely suppress the nonaxisymmetric mode.

In contrast, in the embodiment of the invention, a plasma uniform over a large area can be generated by introducing a microwave M through the coaxial conversion section 30 and the annular ring slot 40 into the integral dielectric window 50.

More specifically, in order to solve the problem arising in the case where a cavity is formed on the dielectric as in the above comparative examples, a microwave M is introduced through the coaxial conversion section 30 in the embodiment of the invention. Here, the coaxial conversion radius is R, which is half the center-to-center distance 2R of the annular space formed around the generally disk-shaped shield 36. As shown in FIG. 2, the microwave M supplied through the waveguide 10 travels in the coaxial introduction section 20 downward in the figure, spreads in the coaxial conversion section 30 in the in-plane direction, travels downward around the disk-shaped shield 36, and is introduced through the ring slot 40 into the chamber 100. By coaxial conversion, the microwave is converted into a TEM wave (transverse electric magnetic wave), and its electromagnetic field distribution is concentric. That is, the intensity of the microwave is uniform in the concentric ring slot 40. By introducing the microwave having uniform intensity not into the center of the chamber 100 but into its periphery, a plasma uniform over a large area can be easily generated.

Furthermore, in the microwave introduction section like this, the dimensional parameters A, B, C1, and C2 (see FIG. 2) of the coaxial conversion section 30 can be suitably determined to achieve nearly 100% matching between the microwave inlet Min and the microwave outlet Mout. That is, the introduced microwave can be efficiently introduced into the chamber with its reflection suppressed. Furthermore, the conversion radius R can be suitably determined to optimize the microwave introduction region, and the electron density distribution as viewed radially from the chamber center.

On the other hand, in the comparative examples shown in FIGS. 6 and 7, a nonaxisymmetric mode and the like may occur because the slot and the dielectric window are divided into a plurality of parts. In contrast, in this embodiment, the microwave is supplied through the generally annular ring slot 40 into the single dielectric window 50.

Figure 9:
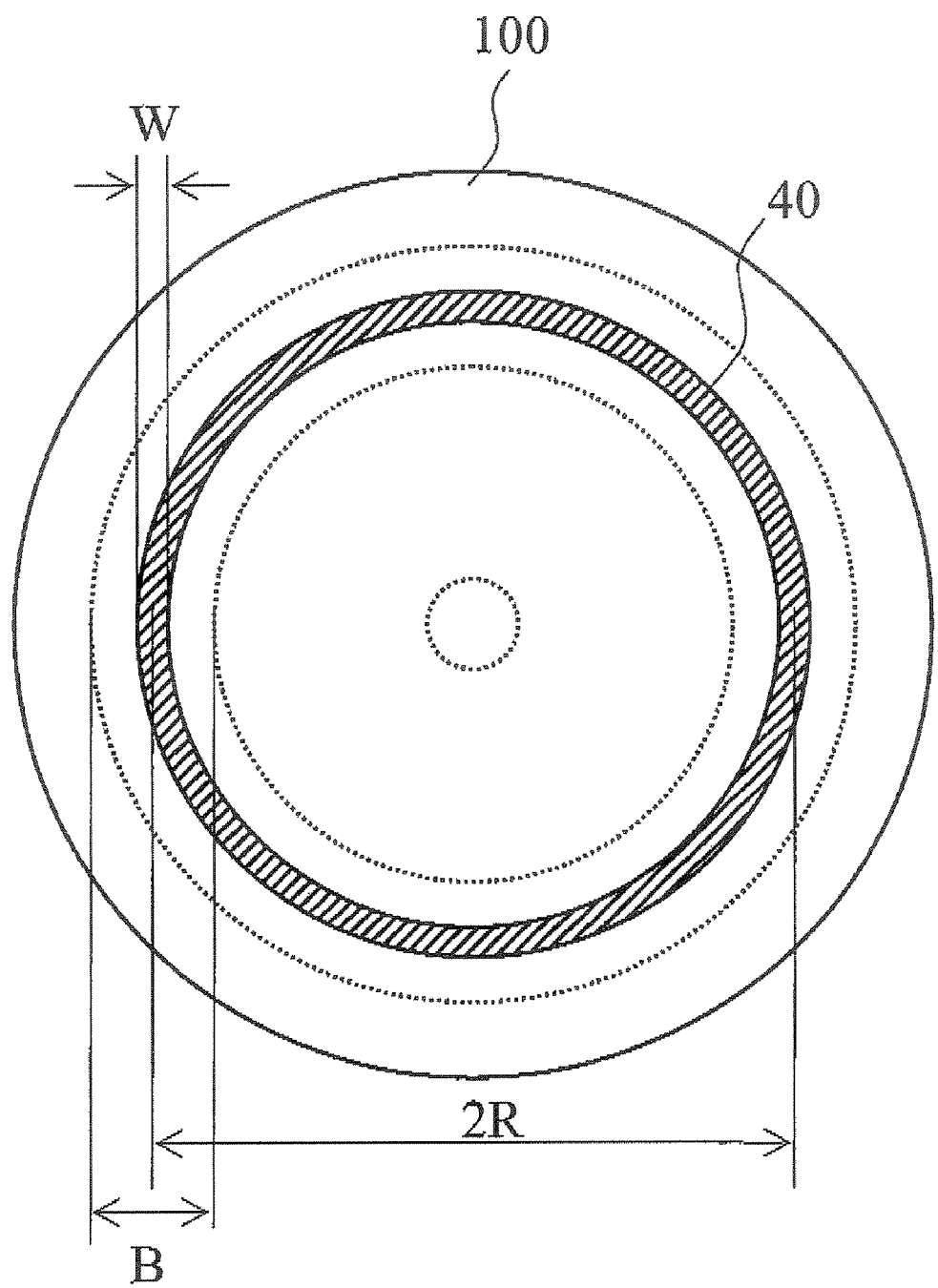
FIG. 9 is a schematic view showing the planar configuration of a ring slot of this embodiment of the invention.

FIG. 9 is a schematic view showing the planar configuration of the ring slot of this embodiment.

In the embodiment of the invention, no cavity is used for introducing the microwave. This allows continuous control of plasma density without complicated adjusting means like plungers as illustrated in FIG. 8. Furthermore, the average radius of the slot 40 (the radius measured at the widthwise center of the ring slot) is preferably close to the coaxial conversion radius R as shown in FIGS. 2 and 9. Moreover, the electric field density can be increased by suitably narrowing the width W of the ring slot 40. Specifically, the width W can be set to approximately several millimeters, for example.

Figure 10:
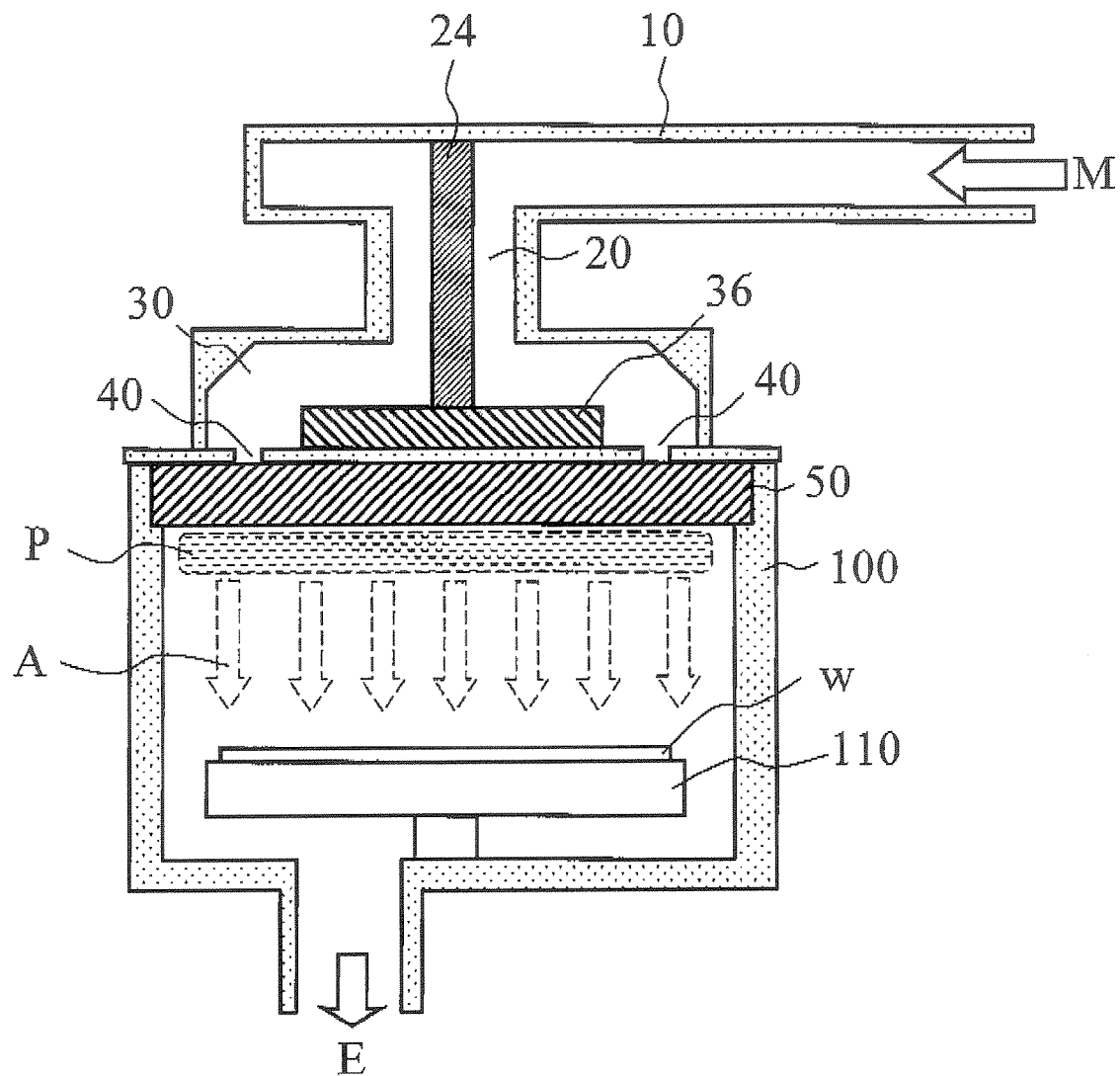
FIG. 10 is a schematic view illustrating the situation where the plasma generating apparatus of this embodiment of the invention is used to generate a plasma P.

FIG. 10 is a schematic view illustrating the situation where the plasma generating apparatus of this embodiment is used to generate a plasma P.

The microwave M emitted through the ring slot 40 to the window 50 propagates on the surface of the window 50 and is emitted into the chamber 100. By the energy of the microwave M thus emitted into the chamber 100, a plasma P of the processing gas is formed. When the electron density in the plasma thus generated exceeds the density that enables the microwave M supplied through the window 50 to be shielded (cutoff density), the microwave is reflected within a certain distance (skin depth) d from the lower surface of the window 50 into the processing space inside the chamber, and a standing wave of the microwave is formed.

Then the reflection surface of the microwave serves as a plasma excitation surface, where a stable plasma P is excited. In the stable plasma P excited on this plasma excitation surface, ions and electrons collide with processing gas molecules to generate excitation active species (plasma products) such as excited atoms, molecules, and free atoms (radicals). These plasma products diffuse in the processing space as shown by arrows A and fly onto the surface of the workpiece W, allowing plasma processings such as etching, ashing, thin film deposition, surface modification, and plasma doping. According to this embodiment, as shown in the figure, a plasma P uniform over a large area can be stably generated. Active species A produced in the plasma P are allowed to act uniformly on the workpiece W, enabling rapid plasma processing uniform over a large area.

As described later in detail with reference to examples, it has turned out as the result of experiments by the inventors that, if the dimensional parameters A and B are set to be nearly equal to each other, the dimensional parameters C1 and C2 to be 0.5 to 0.8 times A, the conversion radius R to be approximately 10 times the dimensional parameter A, and the width W of the ring slot 40 to be approximately 0.1 to 0.3 times the dimensional parameter A, then the microwave M is efficiently introduced into the chamber, allowing a dense and uniform plasma to be formed.

Figure 11:
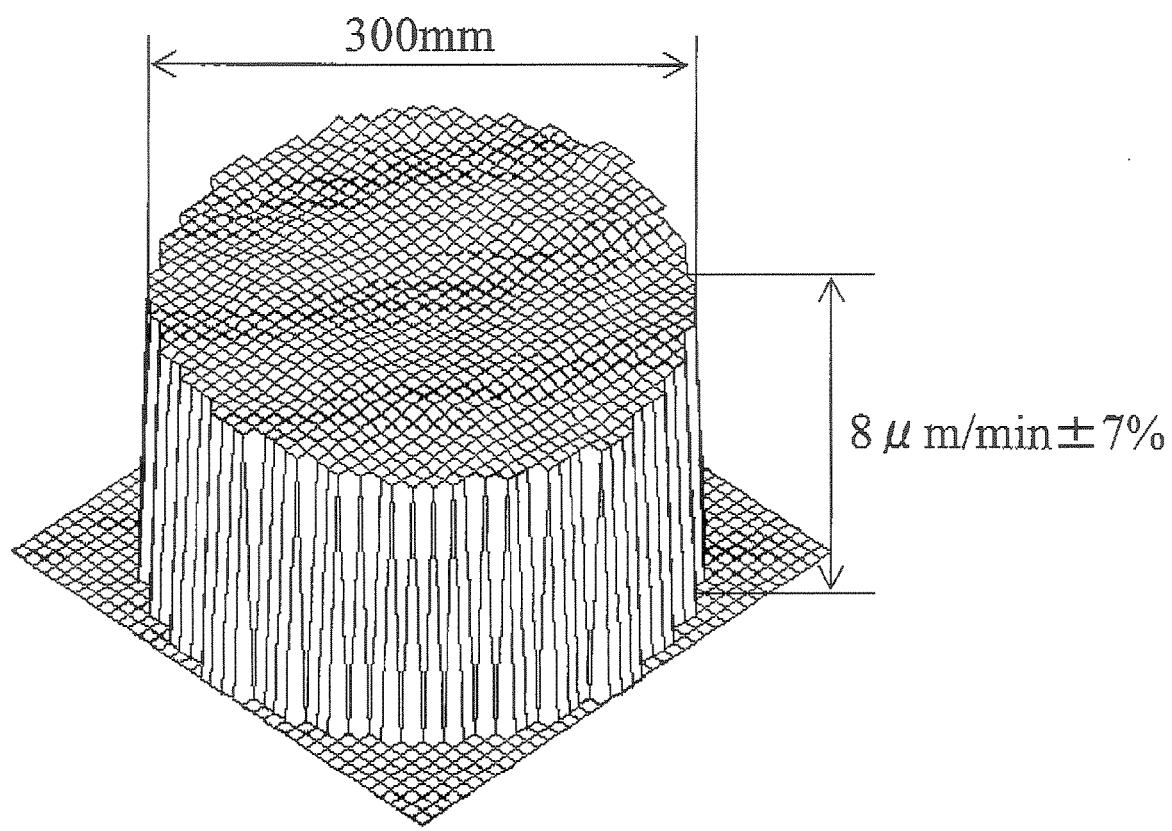
FIG. 11 is a graph illustrating the result of an experiment performed by the inventors.

FIG. 11 shows a graph illustrating the result of an experiment performed by the inventors.

This figure shows a two-dimensional distribution of resist ashing rate. More specifically, using here the plasma processing apparatus illustrated in FIGS. 1 to 3, a resist applied onto a wafer having a diameter of 12 inches (approximately 300 millimeters) was ashed, and the two-dimensional distribution of ashing rate was characterized. The oxygen partial pressure in the chamber 100 was 200 pascal (Pa), the microwave M had a frequency of 2.45 GHz and a power of 3 kW, and the flow rate was 6000 SCCM. The dimensional parameters of the coaxial conversion section 30 were as follows:

A:B:C1:C2:R:W=1:1.04:0.73:0.54:10:015

As the result of this experiment, it was confirmed that the ashing rate was as high as nearly 8 micrometers per minute and that the in-plane variation of ashing rate fell within ±7 percent throughout the diameter of 300 millimeters. That is, a plasma uniform and dense over a large area was successfully generated.

In the following, plasma processing apparatuses serving as variations of this embodiment are described.

Figure 12:
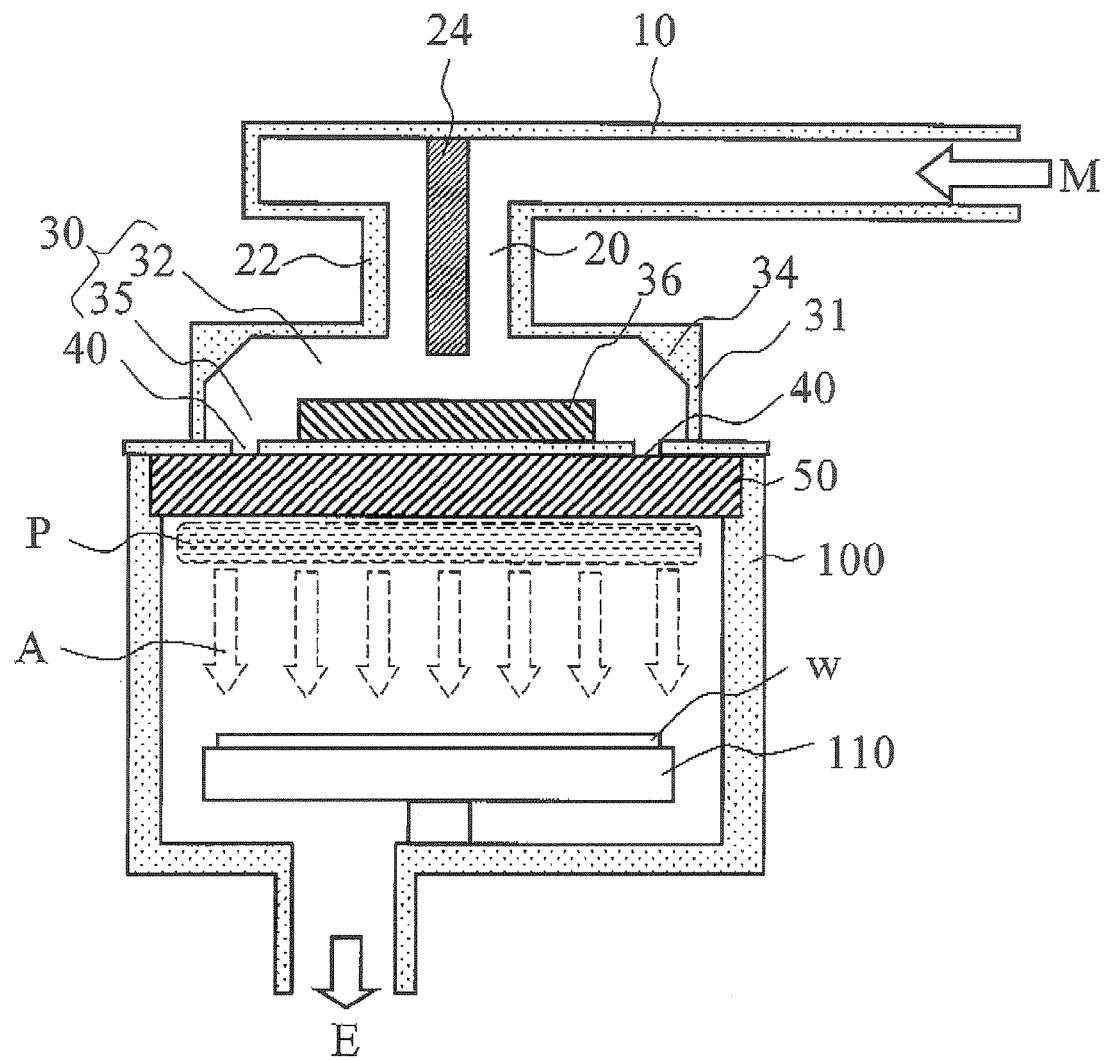
FIG. 12 is a schematic cross-sectional view showing a plasma processing apparatus according to a first variation of this embodiment of the invention.

FIG. 12 is a schematic cross-sectional view showing a plasma processing apparatus according a first variation of this embodiment.

More specifically, in this variation, the core 24 of the coaxial introduction section 20 is not linked to the shield 36 of the coaxial conversion section 30, but spaced apart. Such a structure also enables efficient coaxial conversion.

Figure 13:
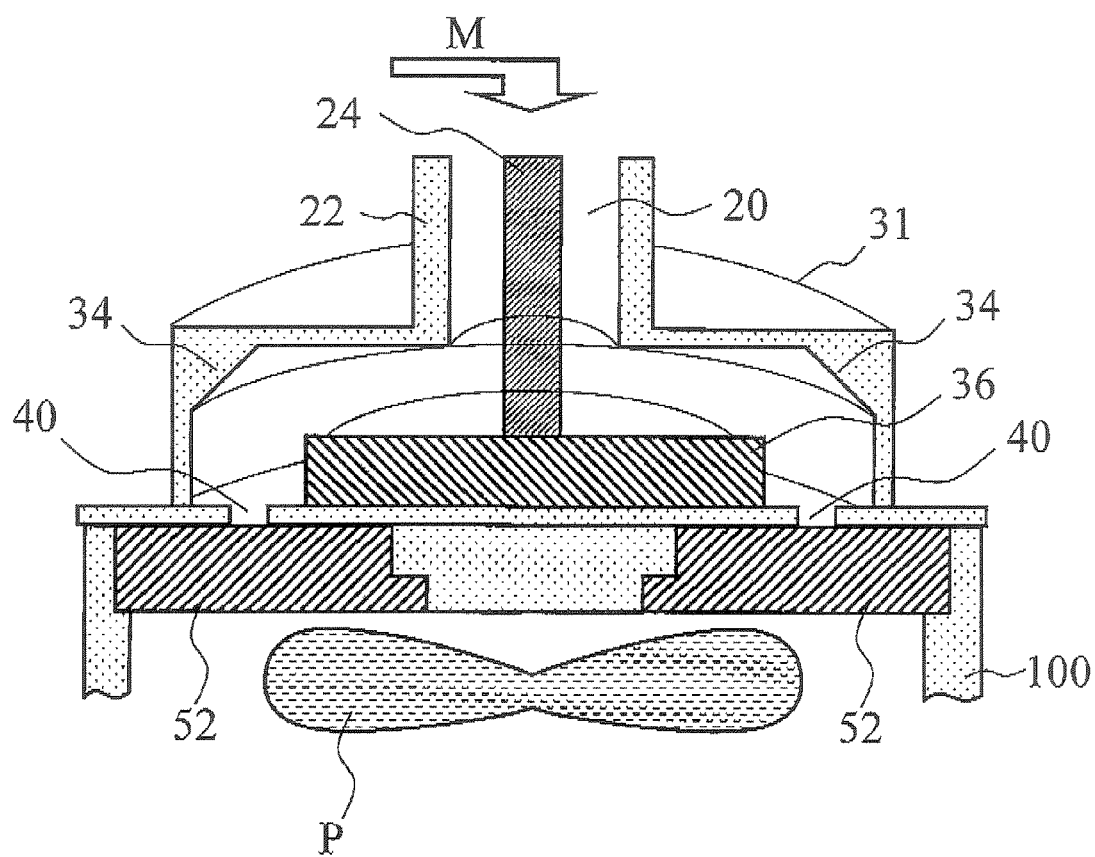
FIG. 13 is a schematic cross-sectional view showing a plasma processing apparatus according to a second variation of this embodiment of the invention.

FIG. 13 is a schematic cross-sectional view showing a plasma processing apparatus according a second variation of this embodiment.

More specifically, in this variation, the window 52 is made of a ring-shaped dielectric. In this configuration, the microwave M is not introduced into the vicinity of the center of the chamber 100, but is introduced only into its periphery. Hence, if this variation is used in the case where the plasma density is high at the center of the chamber 100, introduction of the microwave is restrained at the chamber center, and uniformity of the plasma P can be enhanced.

Figure 14:
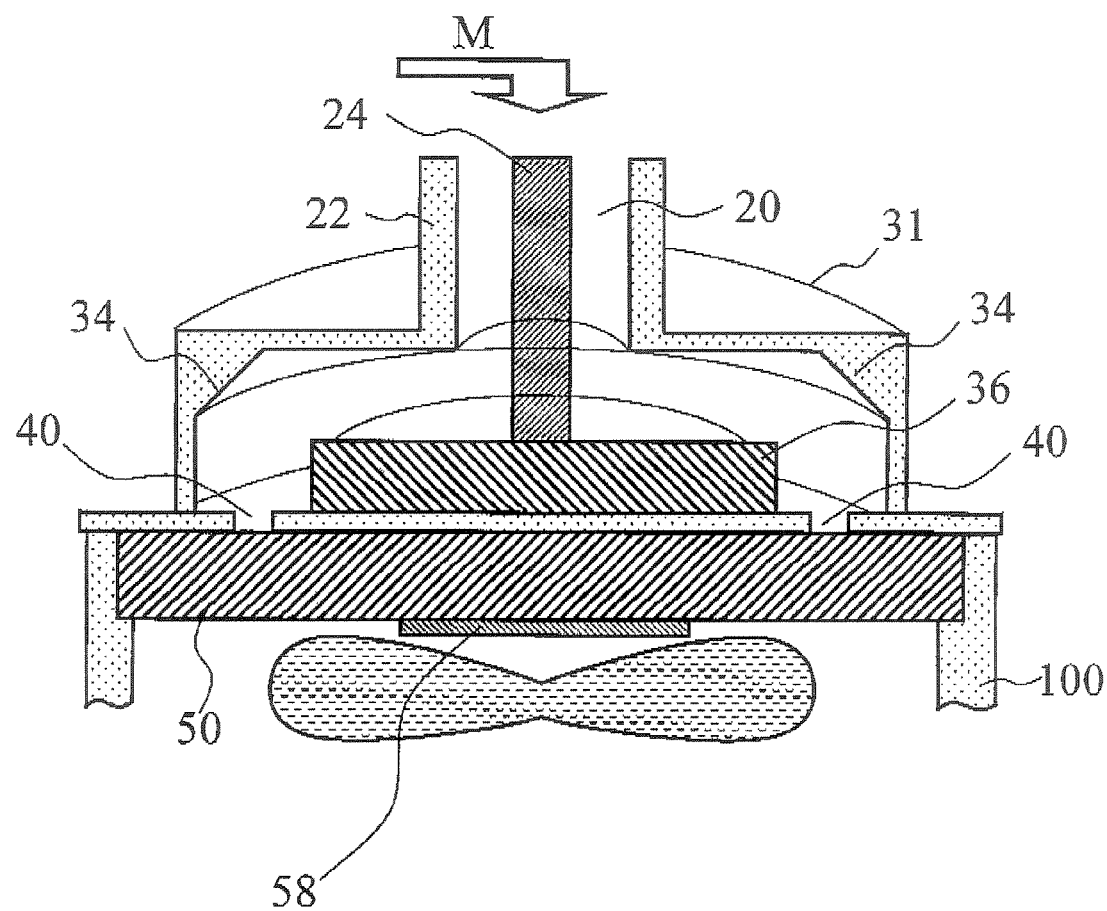
FIG. 14 is a schematic cross-sectional view showing a plasma processing apparatus according a third variation of this embodiment of the invention.

FIG. 14 is a schematic cross-sectional view showing a plasma processing apparatus according a third variation of this embodiment.

More specifically, in this variation, the window 50 is made of a single disk-shaped dielectric, and a shield plate 58 is provided on its lower surface. The shield plate 58 is illustratively metallic and is provided so as to cover the vicinity of the center of the window 50. Such a shield plate 58 also serves to prevent a plasma P from being generated at the center of the chamber, and uniformity of the plasma can be enhanced.

Next, a second embodiment of the invention is described.

Figure 15:
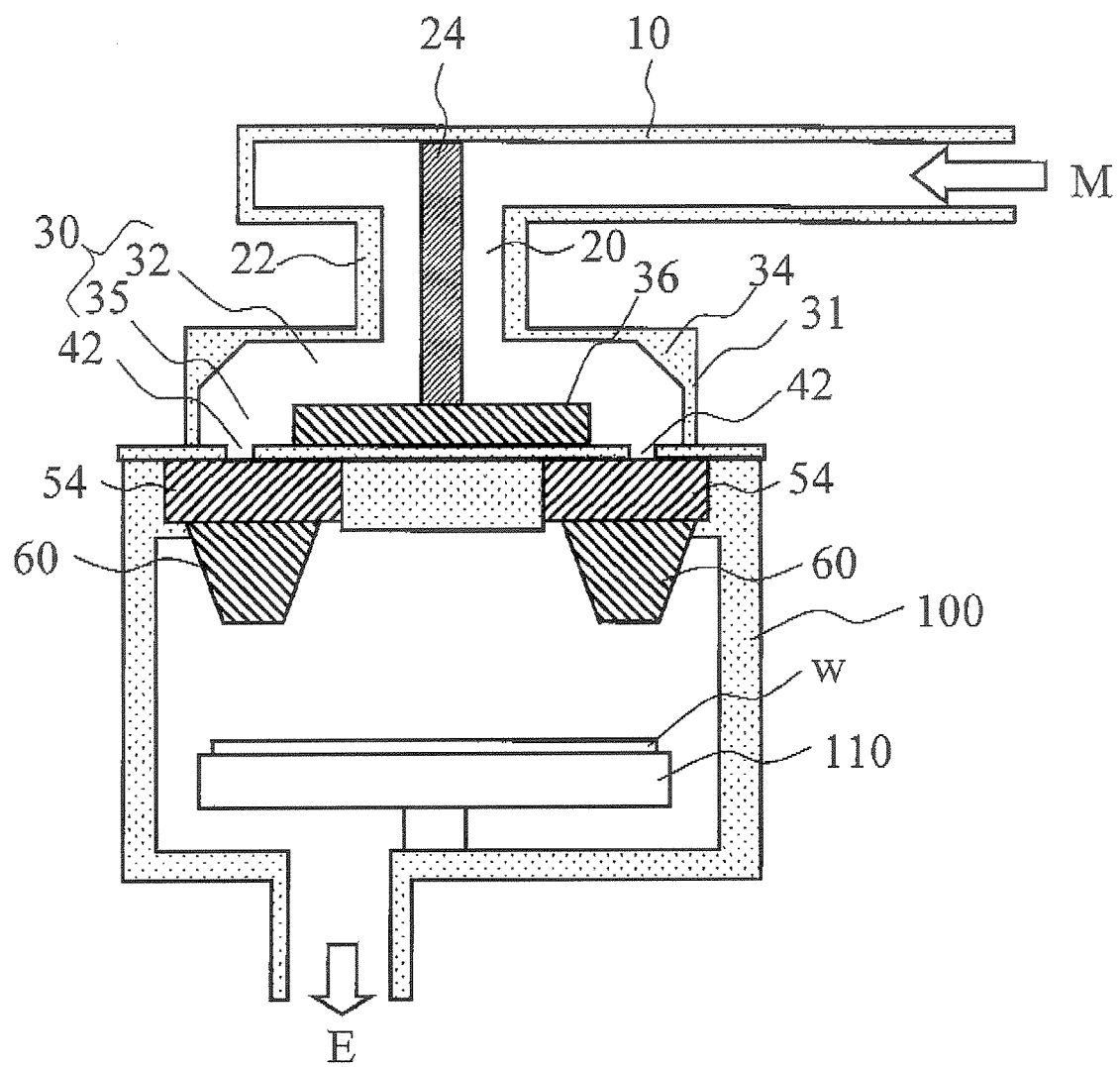
FIG. 15 is a schematic cross-sectional view showing a plasma processing apparatus according to a second embodiment of the invention.

FIG. 15 is a schematic cross-sectional view showing a plasma processing apparatus according a second embodiment of the invention.

Figure 16:
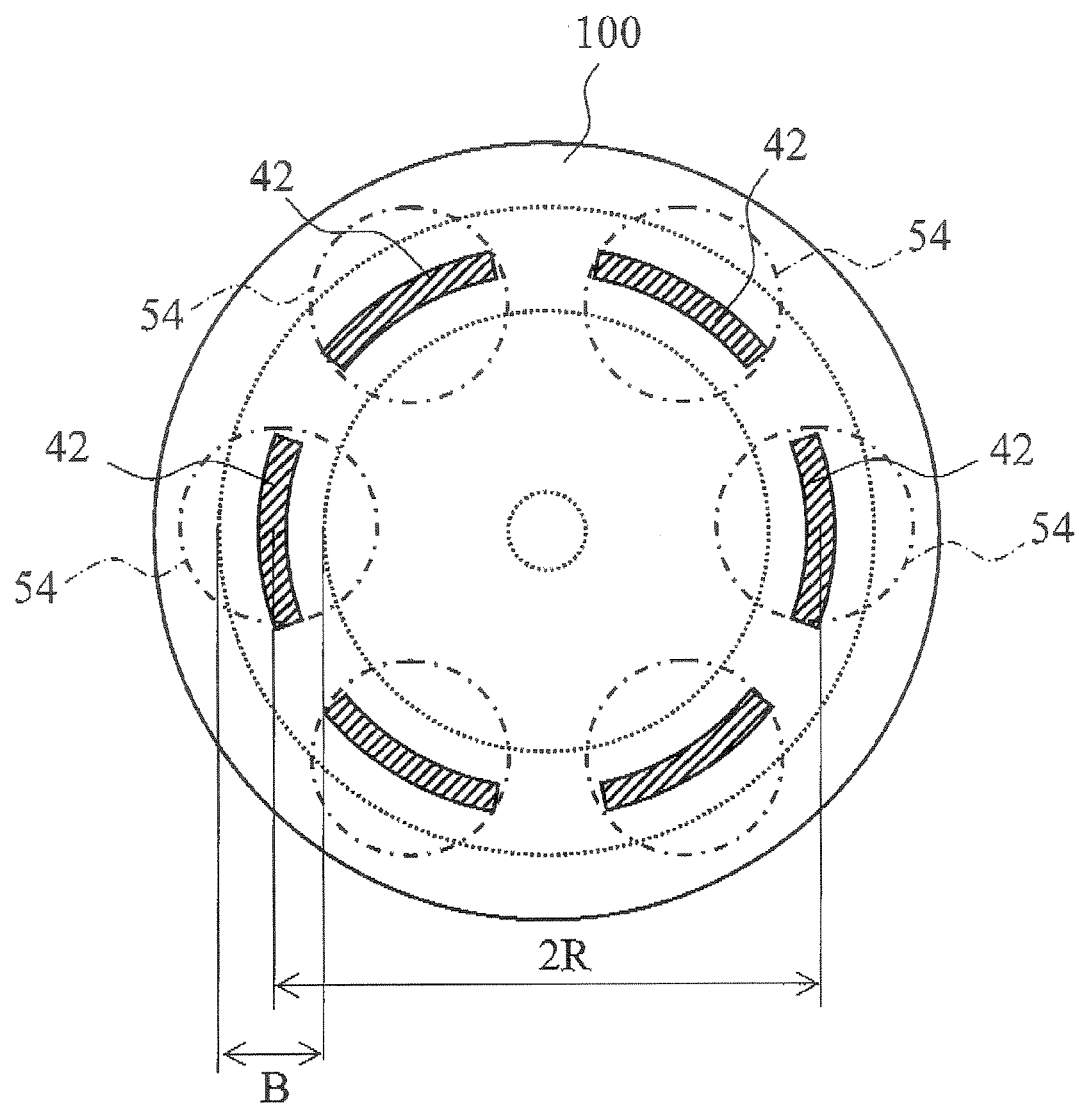
FIG. 16 is a schematic view illustrating the planar configuration of its slot of the second embodiment.

FIG. 16 is a schematic view illustrating the planar configuration of its slot.

More specifically, also in this embodiment, the microwave M supplied through the waveguide 10 is coaxial-converted through the coaxial introduction section 20 and the coaxial conversion section 30. In this embodiment, a plurality of slots 42 are disposed on a generally identical circle. Corresponding to these slots 42, a plurality of dielectric windows 54 are provided. Furthermore, each of these windows 54 is provided with a protrusion 60 protruding to the inside of the chamber 100. The protrusion 60 has a generally truncated-cone or generally truncated-pyramid shape tapered toward its tip. The microwave W coaxial-converted in the coaxial conversion section 30 is introduced through the slots 42, the windows 54, and the protrusions 60 into the chamber 100.

Even for a plurality of divided windows 54, such protrusions 60 serves to reliably ignite a plasma at each window 54, and a stable plasma can be produced.

Figure 17:
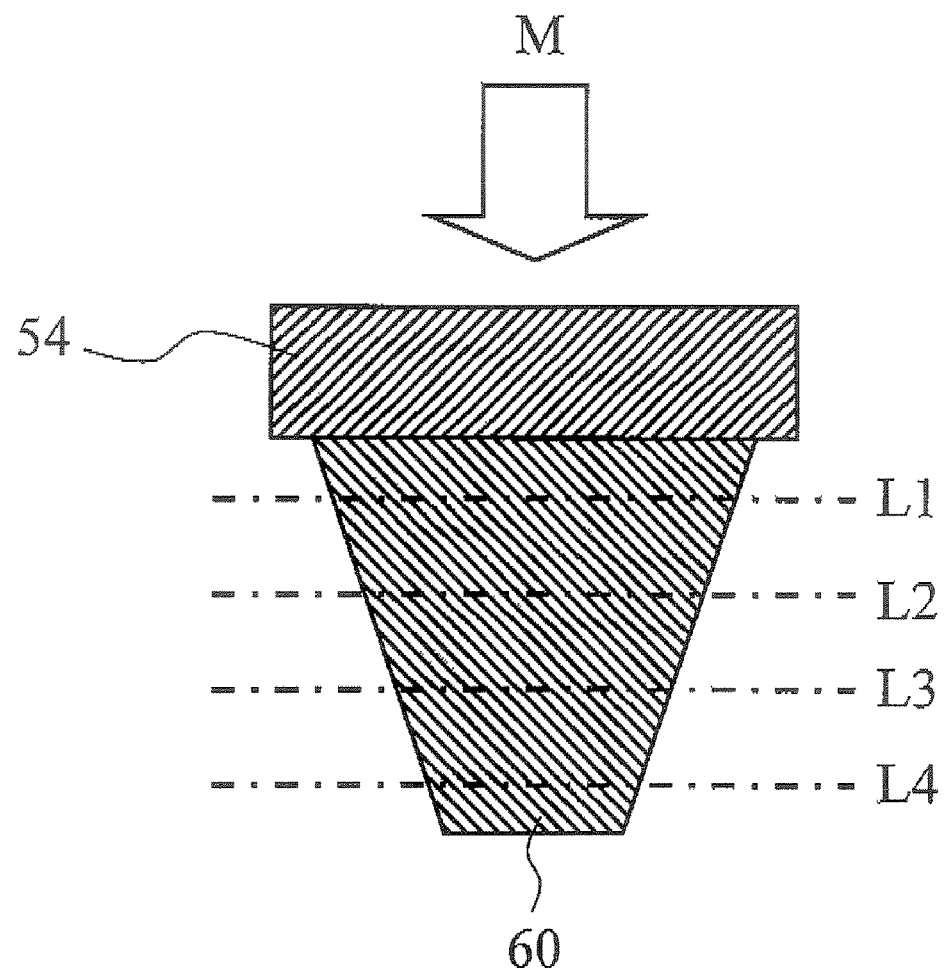
FIG. 17 is an enlarged schematic view of one of the protrusions 60.

FIG. 17 is an enlarged schematic view of one of the protrusions 60.

To efficiently supply microwave power to a plasma through a dielectric, they need to be coupled to each other. The number of modes that a microwave can excite in a dielectric increases as the size of the dielectric becomes larger. Hence, for a high density plasma, it is preferable to supply a microwave M through a dielectric having a large size. On the other hand, for a low density plasma, it is preferable to supply a microwave through a dielectric having a small size with excitation modes suppressed.

As illustrated in FIG. 17, this variation includes a protrusion 60 tapered toward its tip. In general, the density of a plasma P decreases with the distance from the microwave source. That is, in FIG. 17, the density of the plasma decreases with its distance from L1 to L4. Accordingly, the diameter of the protrusion 60 is gradually reduced, and the number of modes that a microwave can excite in the dielectric also decreases.

More specifically, coupling occurs on the side close to L1 when the plasma has high density, and coupling is achieved on the side close to L4 when the plasma has low density. That is, this embodiment ensures that optimal coupling to the microwave can be achieved depending on the density of the plasma.

Inside the chamber 100, in many cases, the ignition condition and maintenance condition of the plasma are not always identical depending on the distribution of gas flow and pressure therein and the positional relationship of internal structures, for example. However, according to this embodiment, a protrusion 60 is provided for each of a plurality of slots 42. Thus a plasma can be reliably ignited at each protrusion 60 and stably maintained.

It was confirmed as the result of experiments by the inventors that, if the height of the protrusion 60 is 0.8 times or more and 1.6 times or less the wavelength of the microwave propagating therethrough, then the microwave was efficiently absorbed in the protrusion 60 and the stable discharge region expanded. For example, in a plasma processing apparatus with six protrusions 60 disposed in the chamber 100, when the frequency of the microwave was 2.45 GHz, it was confirmed that, if the protrusion 60 is formed from quartz and its height is 50 millimeters or more and 100 millimeters or less, then the microwave is efficiently absorbed in every protrusion 60, expanding the stable discharge region.

The embodiment of the invention has been described with reference to examples. However, the invention is not limited to these examples.

For instance, the elements used in the embodiment of the invention such as the waveguide 10, coaxial introduction section 20, coaxial conversion section 30, slot, or window are not limited in shape and size to those shown in the drawings. The cross-sectional shape, the wall thickness, the shape and size of the opening, and the material may be suitably modified to achieve the same operation and effect, and such modifications are encompassed within the scope of the invention.

The waveguide does not need to be completely rectangular. Also, the coaxial introduction section and the coaxial conversion section do not need to be completely cylindrical.

The shape and size of the plasma processing chamber and its positional relationship with the plasma generator are not limited to those shown in the drawings, but can be suitably determined by considering the content and condition of the plasma processing. For example, the plasma generator may be attached not to the upper surface of the plasma processing chamber, but to its side or lower surface, or the combination thereof is also possible. That is, a plurality of plasma generators may be attached to one plasma processing chamber. Then a large-area plasma being uniform or having a prescribed density distribution can be formed in accordance with the shape and size of the workpiece.

Furthermore, in the above examples, only the configuration of the main part of the plasma generating apparatus and the plasma processing apparatus is described. However, the invention encompasses all the plasma processing apparatuses including such a plasma generating apparatus. For example, any plasma processing apparatus embodied as an etching apparatus, ashing apparatus, thin film deposition apparatus, surface processing apparatus, and plasma doping apparatus is encompassed within the scope of the invention.

INDUSTRIAL APPLICABILITY

As described in detail, according to the invention, a plasma generating apparatus and a plasma processing apparatus capable of forming a plasma uniform over a large area can be realized at low cost.

Hence, for example, it is also easily feasible to form a large-area and uniform plasma, or conversely, to form a locally strong plasma.

Consequently, plasma processing such as etching, ashing, thin film deposition, surface modification, or plasma doping can be uniformly and rapidly performed on large-area semiconductor wafers and liquid crystal display substrates, or local plasma processing can be also performed on various workpieces, achieving significant industrial advantages.

The invention claimed is:

1. A plasma generating apparatus, comprising:
coaxial conversion means for coaxial-converting a microwave, the coaxial conversion means including:
   a coaxial introduction section having a generally cylindrical waveguide provided generally coaxially with a central axis of a generally annular ring slot and a core provided near the central axis, the coaxial introduction section propagating the microwave generally parallel to the central axis; and
   a coaxial conversion section where the microwave propagated through the coaxial introduction section is spread generally perpendicular to the central axis in a cylindrical space provided generally coaxially with the central axis and is guided to the generally annular ring slot through an annular space provided generally coaxially with the central axis, wherein
the generally annular ring slot passes the coaxial-converted microwave,
a dielectric window propagates the microwave passed through the generally annular ring slot,
a plasma is produced by the microwave propagated through the dielectric window,
the cylindrical space has a length (A) parallel to the central axis,
the annular space has a width (B) perpendicular to the central axis, and
the length (A) is generally identical to the width (B).

2. The plasma generating apparatus according to claim 1, wherein the dielectric window is generally disk-shaped.

3. The plasma generating apparatus according to claim 1, wherein the dielectric window is generally ring-shaped.

4. The plasma generating apparatus according to claim 1, further comprising a generally disk-shaped shield plate opposed to the generally annular ring slot across the dielectric window.

5. A plasma generating apparatus, comprising:
coaxial conversion means for coaxial-converting a microwave, the coaxial conversion means including:
   a coaxial introduction section having a generally cylindrical waveguide provided generally coaxially with a central axis and a core provided near the central axis, the coaxial introduction section propagating the microwave generally parallel to the central axis; and
   a coaxial conversion section where the microwave propagated through the coaxial introduction section is spread generally perpendicular to the central axis in a cylindrical space provided generally coaxially with the central axis and is guided to a plurality of slots through an annular space provided generally coaxially with the central axis, wherein
the plurality of slots is provided on a generally identical circle as viewed from the central axis of the coaxial conversion means, the plurality of slots passing the coaxial-converted microwave,
a dielectric member propagates the microwave passed through the plurality of slots and has a protrusion tapered toward a tip located opposite to the plurality of slots,
a plasma is produced by the microwave propagated through the dielectric member,
the cylindrical space has a length (A) parallel to the central axis,
the annular space has a width (B) perpendicular to the central axis, and
the length (A) is generally identical to the width (B).

6. The plasma generating apparatus according to claim 1, wherein
the generally annular ring slot has an average radius (R) and a width (W),
the radius (R) is generally 10A, and
the width (W) is within a range from 0.1 A to 0.3 A.

7. A plasma processing apparatus, comprising:
the plasma generating apparatus according to claim 1 or 5, wherein plasma processing of a workpiece is performed by the generated plasma.

8. The plasma generating apparatus according to claim 7, wherein
the protrusion has a height (H) and the microwave has a wavelength (Wm) propagating through the dielectric member, and
the height (H) is within a range from 0.8 μm to 1.6 μm.

9. The plasma generating apparatus according to claim 7, wherein
each of the plurality of slots has an average radius (R) and a width (W),
the radius (R) is generally 10A, and
the width (W) is within a range from 0.1 A to 0.3 A.

10. The plasma generating apparatus according to claim 1 or 7, wherein
the cylindrical space has a bevel at a corner opposite to the annular space,
the bevel has a length (C1) parallel to the central axis and a length (C2) perpendicular to the central axis, and
the length (C1) and the length (C2) are each within a range from 0.5 A to 0.8 A.

* * * * *